United States Patent
Kim et al.

(10) Patent No.: US 8,274,600 B2
(45) Date of Patent: Sep. 25, 2012

(54) CAMERA MODULE PACKAGE

(75) Inventors: Ho Kyoum Kim, Gyunggi-do (KR);
Gab Yong Kim, Gyunggi-do (KR);
Hyung Chan Kwak, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 241 days.

(21) Appl. No.: 12/588,958

(22) Filed: Nov. 3, 2009

(65) Prior Publication Data

US 2010/0157143 A1 Jun. 24, 2010

(30) Foreign Application Priority Data

Dec. 24, 2008 (KR) .................. 10-2008-0133444

(51) Int. Cl.
*H04N 5/225* (2006.01)
*H01L 21/00* (2006.01)
*H01L 23/02* (2006.01)

(52) U.S. Cl. .................. 348/374; 438/65; 257/680

(58) Field of Classification Search .............. 348/373, 348/374; 438/65, 68; 257/680
See application file for complete search history.

(56) References Cited

U.S. PATENT DOCUMENTS

| | | | |
|---|---|---|---|
| 2003/0128442 A1* | 7/2003 | Tanaka et al. | 359/819 |
| 2008/0079829 A1 | 4/2008 | Choi et al. | |
| 2008/0316117 A1* | 12/2008 | Hill et al. | 343/702 |

FOREIGN PATENT DOCUMENTS

| | | |
|---|---|---|
| JP | 2007-243550 | 9/2007 |
| KR | 10-2005-0082018 | 8/2005 |
| KR | 10-2008-0031570 A | 4/2008 |

OTHER PUBLICATIONS

Korean Office Action issued Nov. 16, 2010 in corresponding Korean Patent Application 10-2008-0133444.
Communication, including European Search Report, issued by the European Patent Office on May 8, 2012 in the corresponding European patent application 09252630.0.

\* cited by examiner

*Primary Examiner* — Chieh M Fan
*Assistant Examiner* — Dillon Durnford Geszvain

(57) ABSTRACT

A camera module package is disclosed. The camera module package is capable of preventing defects caused by foreign bodies and enhancing product reliability by reducing the time consumed in a packaging process for manufacturing a camera module, and of reducing the size of a package and manufacturing costs by excluding the use of gold wires.

7 Claims, 4 Drawing Sheets

CAMERA MODULE PACKAGE

CROSS-REFERENCE TO RELATED APPLICATIONS

This application claims the priority of Korean Patent Application No. 10-2008-0133444 filed on Dec. 24, 2008, in the Korean Intellectual Property Office, the disclosure of which is incorporated herein by reference.

BACKGROUND OF THE INVENTION

1. Field of the Invention

The present invention relates to a camera module package, and more particularly, to a camera module package which can reduce the time required for a packaging process by connecting an image sensor to a board using screen printing.

2. Description of the Related Art

In general, personal mobile devices, such as electronic devices, mobile phones and personal digital assistants (PDAs), are provided with additional features, as well as their main features and functions. Of late, camera features have been increasingly adopted in a variety of electronic devices.

Camera modules, now considered one of the most basic features, are in development in line with the continuing development of mobile communications devices. To address the increasing need of the market, camera modules with more functions are in demand.

The expansion of the market has caused more manufacturers to produce camera modules, thus increasing price competition. Therefore, a reduction in loss rates in camera module manufacturing costs and yields may be considered to determine the price competitiveness of manufacturers.

Image sensors, which play a pivotal role in camera modules, are electrically connected to circuit components via conductive wires (generally, gold wires) by using chip-on-board (COB) packaging.

However, COB packaging has limitations in that pads are interconnected one by one in sequential order, after the image sensor is placed in position.

Although the development of camera equipment has contributed to reducing the time consumed in interconnecting contact pads, this reduction in time is limited because sensors with higher pixel resolution and higher performance require more pads to be connected.

COB packaging is performed, with circuit components grouped into a single array. At this time, a long process time for wire bonding may increase defects caused by foreign bodies, which have a significant influence on the yield of camera modules.

Long period of image sensor exposure to the outside environment may increase defects caused by foreign bodies. Therefore, reducing the duration of this exposure time is considered crucial in yield management.

Particularly, as demand for low-priced camera modules is growing and the market of such low-priced camera modules has now matured, the need has arisen to reduce production costs and execute the process of packaging at the highest possible rate.

Therefore, techniques are required which can simplify the structure and reduce the size of camera modules and manufacturing costs, with regard to the process of packaging.

SUMMARY OF THE INVENTION

An aspect of the present invention provides a camera module package, which can prevent defects from occurring due to foreign bodies and enhance product reliability by reducing the time consumed in a packaging process for manufacturing a camera module, and can reduce the size of a package and manufacturing costs by excluding the use of gold wires.

According to an aspect of the present invention, there is provided a camera module package including: a housing having an inner space in an upper portion thereof; a lens barrel coupled to the housing through the inner space and receiving one or more lenses; an image sensor including an imaging area converting light, falling thereon via the lens, into an electrical signal, and a sensor contact pad; a board including a cavity receiving the image sensor, and an external contact pad; and a connection part electrically connecting the external contact pad to the sensor contact pad.

The cavity may have substantially the same depth as the thickness of the image sensor.

The cavity may have a greater size than the image sensor to form a gap between the cavity and edges of the image sensor.

The connection part may be provided using screen-printing and cover the sensor contact pad and the external contact pad integrally to electrically connect the sensor contact pad to the external contact pad.

The connection part may be formed of a conductive material.

The camera module package may further include an adhesive provided between the image sensor and the cavity to fix the image sensor in the cavity.

The adhesive may be provided along edges of the image sensor to fix the image sensor in the cavity.

The adhesive may have a top surface on substantially the same plane as top surfaces of the image sensor and the board.

The camera module package may further include a filter provided on the image sensor to protect the imaging area of the image sensor from external foreign bodies.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
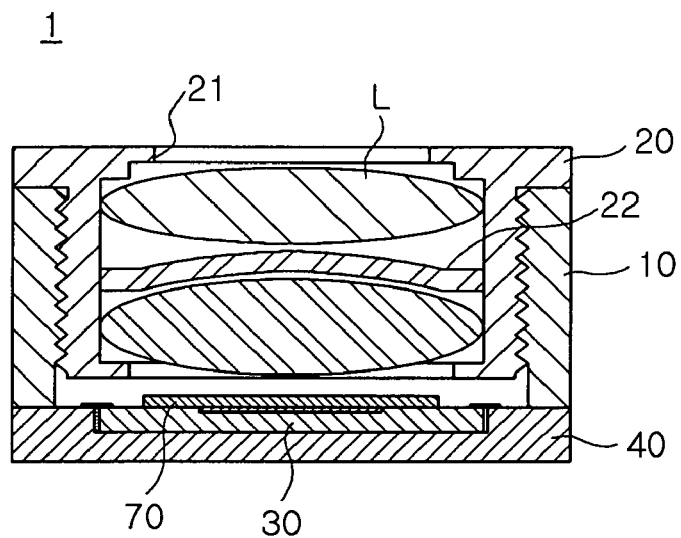
FIG. 1 is a cross-sectional view illustrating a camera module package according to an exemplary embodiment of the present invention.

FIG. 1 is a schematic cross-sectional view of a camera module package according to an exemplary embodiment of the present invention.

As shown in FIG. 1, the camera module package, according to this embodiment, includes a housing 10, a lens barrel 20, an image sensor 30, a board 40, and a connection pad 60.

The housing 10 is a plastic molded structure, and has a hollow section in its central portion such that the lens barrel 20 can be coupled thereto. The inner space of the housing 10 accommodates the lens barrel 20 therein.

The bottom of the housing 10 is coupled and supported to the board 40 including the image sensor 30, and is sealed so as to protect the image sensor 30 and the connection pad 60 from the outside environment.

The lens barrel 20 includes one or more lenses L, and has an incidence hole 21 in the central portion of its top surface so that light can pass through.

A screw thread is formed around the outer circumferential surface of the lens barrel 20 and is screw-engaged with the housing 10 into the inner space of the housing 10. The height of the lens barrel 20 is adjusted by rotating the lens barrel 20 clockwise or counterclockwise in order to locate the lens barrel 20 at the designed focal distance.

According to this embodiment, the screw thread is formed to engage the lens barrel 20 with the housing 10. However, the present invention is not limited thereto, and the coupling of the lens barrel 20 to the housing 10 may be made by forcibly inserting the lens barrel 20 into the housing 10 without using the screw thread.

An infrared (IR) filter 22 may be further provided between the lenses L stacked inside the lens barrel 20 so as to block infrared light.

The image sensor 30 is provided, inserted inside the board 40.

The structures of the image sensor 30 and the board 40 will now be described in detail with reference to FIGS. 2 through 6.

Figure 2:
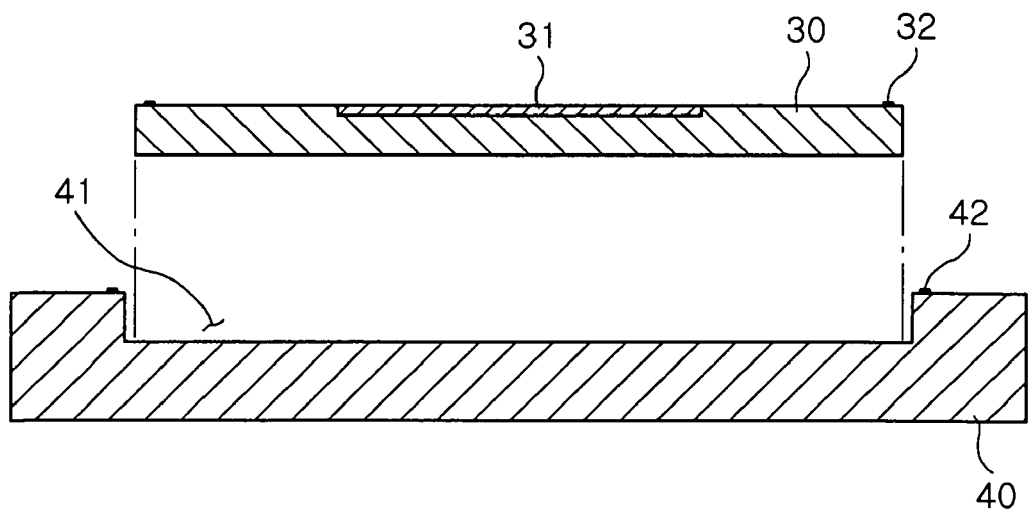
FIG. 2 is an enlarged cross-sectional view illustrating an image sensor and a board in the camera module package depicted FIG. 1.
Figure 3:
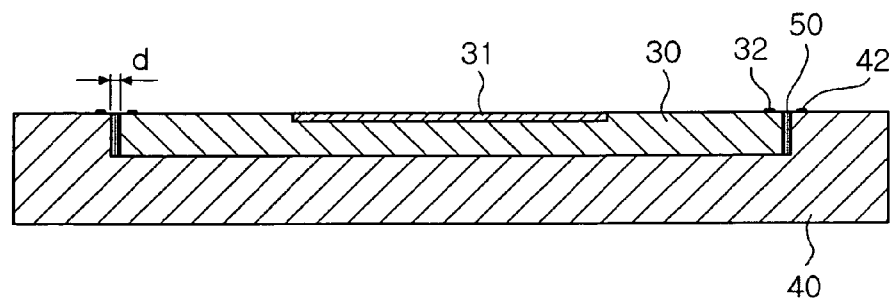
FIG. 3 is an enlarged cross-sectional view illustrating the image sensor coupled to the board, disposed in a cavity of the board depicted in FIG. 2
Figure 4:
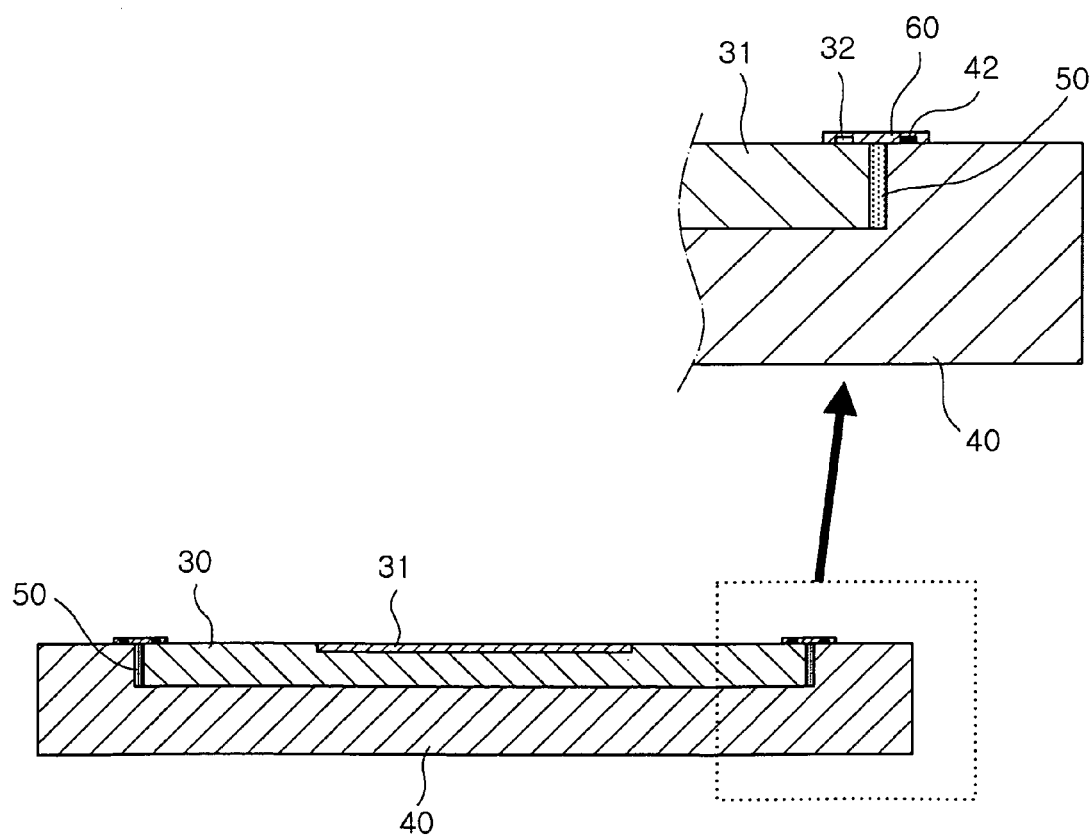
FIG. 4 is an enlarged cross-sectional view illustrating the image sensor connected to the board depicted in FIG. 3 via a connection part.

FIG. 2 is an enlarged cross-sectional view of the image sensor and the board in the camera module package. FIG. 3 is an enlarged cross-sectional view illustrating the image sensor coupled to the board, disposed in the cavity of the board depicted in FIG. 2. FIG. 4 is an enlarged cross-sectional view illustrating the image sensor and the board of FIG. 3 connected together via a connection part.

Figure 5:
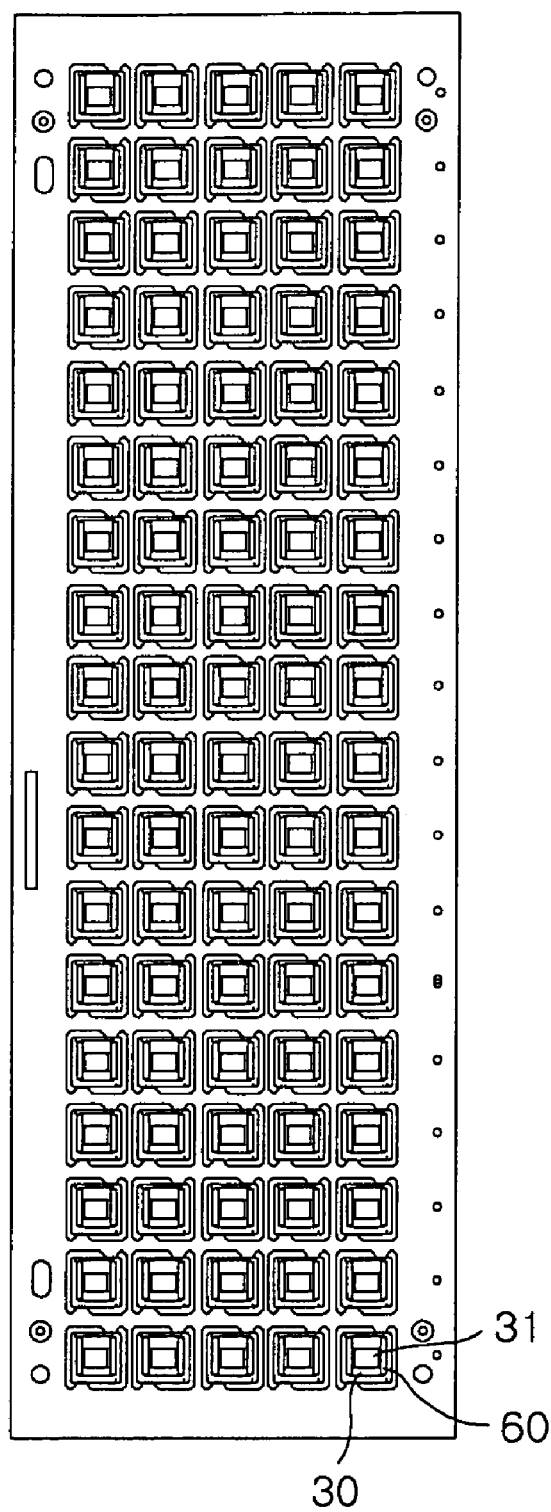
FIG. 5 is a plan view illustrating that the image sensor depicted in FIG. 4 is provided in plurality on a board.
Figure 6:
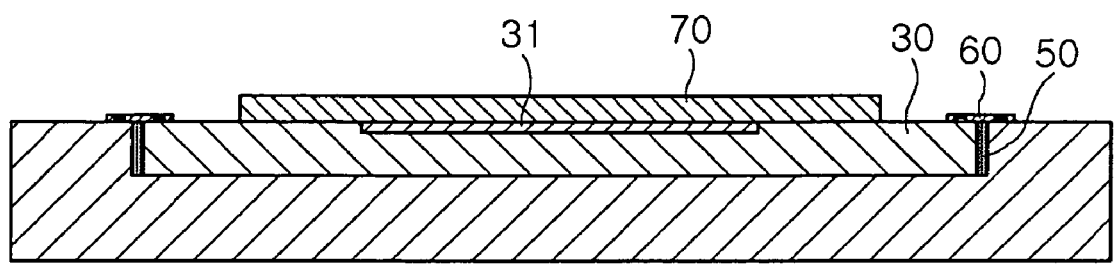
FIG. 6 is an enlarged cross-sectional view illustrating a filter provided on the image sensor depicted in FIG. 4.

FIG. 5 is a schematic plan view illustrating a plurality of image sensors provided on a board. FIG. 6 is an enlarged plan view illustrating a filter provided on the image sensor depicted in FIG. 4.

The image sensor 30 includes an imaging area 31 converting light, falling thereon via the lens L, into an electrical image signal, and a sensor contact pad 32 for the transmission of the image signal to the outside.

As for the image sensor 30, one type of semiconductor device, a charge-coupled device (CCD) image sensor, a complementary metal oxide semiconductor (CMOS) image sensor or the like may be used. In particular, a CMOS image sensor is preferably used since it is suitable for a chip on film (COF) method used to manufacture lightweight, slim camera modules for smaller and multi-functional camera phones. However, the present invention is not limited thereto.

An image of an object captured by the image sensor 30 is converted into an electrical image signal, namely data, and then transmitted to an external display unit (not shown) through the sensor contact pad 32 to be displayed.

The board 40 includes a cavity 41 receiving the image sensor 30, and an external contact pad 42 connected to the sensor contact pad 32 and transmitting the image signal to the display unit.

As for the board 40, a multilayer printed circuit board including an internal circuit or a ceramic board having a stacked structure of a plurality of ceramic sheets may be used.

The cavity 41 has a step structure and may be formed by etching the top surface of the board 40 to a predetermined depth. Alternatively, the cavity 41 may be formed in the process of manufacturing the board 40, by stacking layers, leaving a space for the cavity 41.

As shown in the drawings, the cavity 41 has substantially the same depth as the thickness of the image sensor 30.

Accordingly, the image sensor 30, inserted and received in the cavity 41, is substantially flush with the top surface of the board 40, thereby preventing a difference in height between the board 40 and the image sensor 30.

This brings about a reduction in size, and solves the limitation of the related art camera module package, which is an increase in the overall size (particularly, height) of the package, caused by the thickness of an image sensor mounted on a board.

The cavity 41 is shaped corresponding to the shape of the image sensor 30, and has a greater size than the image sensor 30 so as to form a gap d between the cavity and the edges of the image sensor 30.

Accordingly, the insertion of the image sensor 30 in the cavity 41 is facilitated. The image sensor 30 can be easily disposed in place within the cavity 41 such that the sensor contact pad 32 can be located at a position corresponding to the external contact pad 42.

To fix the image sensor 30, whose location has been adjusted, the gap d between the image sensor 30 and the cavity 41 is filled with an adhesive 50.

The adhesive 50 may be provided only along the edges of the image sensor 30 to fix the image sensor 30 in the cavity 41.

The adhesive 50 filling the gap d has its top surface which is substantially flush with the top surfaces of the image sensor 30 and the board 40.

The adhesive 50 may utilize a thermally curable adhesive, which is hardened in a chamber or a reflow oven, although it is not limited thereto.

Image distortion can be prevented from occurring since the image sensor 30 employs the adhesive 50 between the edges of the image sensor 30 and the walls of the cavity 41, unlike the related art image sensor in which an adhesive is provided on the bottom of the image sensor with an uneven distribution, thus tilting the image sensor and imparting the horizontality thereof.

The adhesive 50 provided along the edges of the image sensor 30 may serve to alleviate impact applied thereto from the outside, thus protecting the image sensor 30.

As shown in FIG. 4, the connection pad 60 electrically connects the external contact pad 42 to the sensor contact pad 32 of the image sensor 30 received and fixed in the cavity 41 of the board 40.

The connection pad 60 is provided by using screen-printing, and covers the sensor contact pad 32 and the external contact pad 42 integrally for the electrical connection therebetween.

In the case that a large number of image sensors 30 are employed for each of a plurality of arrays, the electrical connections between the sensor contact pads 32 and the external contact pads 42 may be obtained collectively using one printing process. Thus, productivity is enhanced, and the process time can be reduced significantly.

Gold wires, used for related art wire bonding, are not required, thus reducing manufacturing costs.

Also, the size of the camera module package can be reduced by the volume occupied by the gold wires.

The connection pads 60 can be provided using screen printing since the image sensor 30 and the board 40 have no height difference because of the cavity 41 provided in the board 40.

The connection pad 60 may be formed of a conductive material for the electrical connection between the sensor contact pad 32 and the external contact pad 42.

As shown in FIG. 6, a protective filter 70 is further provided on the top surface of the image sensor 30 in order to protect the imaging area 31 of the image sensor 30 from foreign bodies.

The filter 70 may be formed of a transparent material such as glass. An IR cut film may be additionally applied to one surface of the filter 70, or the filter 70 itself may be provided in the form of an IR cut filter.

As set forth above, according to exemplary embodiments of the invention, the camera module package reduces the time it takes for the packaging process in manufacturing a camera module, thus reducing defects caused by foreign bodies and enhancing the reliability of a product. Since gold wires are not used, a reduction in the size of the camera module package can be achieved, and manufacturing costs can be saved.

Also, according to the exemplary embodiments of the present invention, a plurality of image sensors are connected collectively, thus enhancing productivity.

While the present invention has been shown and described in connection with the exemplary embodiments, it will be apparent to those skilled in the art that modifications and variations can be made without departing from the spirit and scope of the invention as defined by the appended claims.

What is claimed is:

1. A camera module package comprising:
    a housing having an inner space in an upper portion thereof;
    a lens barrel coupled to the housing through the inner space and receiving one or more lenses;
    an image sensor including an imaging area converting light, falling thereon via the lens, into an electrical signal, and a sensor contact pad formed on an upper side thereof;
    a board including a cavity receiving the image sensor, and an external contact pad formed on an upper side thereof; and
    a connection part electrically connecting the external contact pad to the sensor contact pad,
    wherein the cavity has substantially a same depth as a thickness of the image sensor such that the upper side of the image sensor and the upper side of the board are on a same level, and
    wherein the connection part is provided using screen-printing and covers the sensor contact pad and the external contact pad integrally to electrically connect the sensor contact pad to the external contact pad.

2. The camera module package of claim 1, wherein the cavity has a greater size than the image sensor to form a gap between the cavity and edges of the image sensor.

3. The camera module package of claim 1, wherein the connection part is formed of a conductive material.

4. The camera module package of claim 1, further comprising an adhesive provided between the image sensor and the cavity to fix the image sensor in the cavity.

5. The camera module package of claim 4, wherein the adhesive is provided along edges of the image sensor to fix the image sensor in the cavity.

6. The camera module package of claim 4, wherein the adhesive has a top surface on substantially the same plane as top surfaces of the image sensor and the board.

7. The camera module package of claim 1, further comprising a filter provided on the image sensor to protect the imaging area of the image sensor from external foreign bodies.

* * * * *